(12) United States Patent
Wang et al.

(10) Patent No.: US 12,137,582 B2
(45) Date of Patent: Nov. 5, 2024

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Jiali Wang, Beijing (CN); Chienpang Huang, Beijing (CN); Qiaoqiao Ru, Beijing (CN); Chuntong Jiang, Beijing (CN); Yanqiang Wang, Beijing (CN); Fei Fang, Beijing (CN); Yuanzheng Guo, Beijing (CN); Peng Hou, Beijing (CN); Chao Yang, Beijing (CN); Jie Li, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 533 days.

(21) Appl. No.: 17/472,515

(22) Filed: Sep. 10, 2021

(65) Prior Publication Data

US 2022/0246697 A1 Aug. 4, 2022

(30) Foreign Application Priority Data

Feb. 3, 2021 (CN) .......................... 202110148566.9

(51) Int. Cl.
*H10K 59/12* (2023.01)
*H10K 50/858* (2023.01)
*H10K 50/86* (2023.01)
*H10K 59/35* (2023.01)
*H10K 59/38* (2023.01)

(52) U.S. Cl.
CPC ........... *H10K 59/12* (2023.02); *H10K 50/858* (2023.02); *H10K 50/865* (2023.02); *H10K 59/35* (2023.02); *H10K 59/38* (2023.02)

(58) Field of Classification Search
CPC ........ H10K 59/12; H10K 59/35; H10K 59/38; H10K 59/879; H10K 59/8791; H10K 50/858; H10K 50/865; G02B 5/003; G02B 5/226; G02B 5/28; G02B 5/26; G02B 5/22
See application file for complete search history.

(56) References Cited

U.S. PATENT DOCUMENTS

2020/0075651 A1* 3/2020 Zhang ............... H01L 27/14627
2020/0119113 A1* 4/2020 Lee ....................... G06F 3/0446
(Continued)

*Primary Examiner* — Farun Lu
*Assistant Examiner* — Sandra Milena Rodriguez Villan
(74) *Attorney, Agent, or Firm* — IPro, PLLC

(57) ABSTRACT

Embodiments of the present disclosure disclose a display panel and a display device. The display panel includes: a base substrate, a light-emitting device located on the base substrate, a first flat layer located on a side of the light-emitting device away from the base substrate, and a black matrix located on a side of the first flat layer away from the base substrate, wherein the black matrix has a plurality of opening regions, and color filters are arranged in corresponding opening regions; the color filters are configured to filter external incident light; and the first flat layer has a plurality of first concave faces arranged corresponding to the opening regions, the color filters fill the first concave faces, and the color filters further cover peripheral regions of the first concave faces.

18 Claims, 8 Drawing Sheets

(56) References Cited

U.S. PATENT DOCUMENTS

2022/0085112 A1\* 3/2022 Huang ................. H10K 50/865
2023/0130238 A1\* 4/2023 Zhang ................. H10K 59/873
  257/40

\* cited by examiner

DISPLAY PANEL AND DISPLAY DEVICE

CROSS REFERENCE TO RELATED APPLICATIONS

The present disclosure claims priority to Chinese patent application No. 202110148566.9 filed with the China National Intellectual Property Administration on Feb. 3, 2021, the disclosure of which is hereby incorporated by reference in its entirety.

FIELD

The present disclosure relates to the technical field of display, and particularly to a display panel and a display device.

BACKGROUND

Organic light-emitting diode (OLED) display panels have many advantages such as self-luminous, ultra-thinness, fast response, high contrast, and wide viewing angles, and are currently a type of display panel that has received widespread attention. The related art provides a color filter on encap (COE for short) technology, in which a filter is encapsulated on a light emitting side of the OLED display panel. Since the filter may filter light, after ambient light entering the OLED display panel is reflected by an internal structure of the OLED display panel, an emergence amount of the ambient light from the light emitting side may also be reduced.

According to inventor's research, in the related art, when the OLED display panel is in a dark state, after external light is reflected by the internal structure of the OLED display panel, when the light is emitted from the filter, light concentration in a certain direction is likely to occur, which will lead to color separation and reduces the reliability of the OLED display panel.

SUMMARY

Embodiments of the present disclosure provide a display panel and a display device.

An display panel provided by an embodiment of the present disclosure includes: a base substrate, a light-emitting device located on the base substrate, a first flat layer located on a side of the light-emitting device away from the base substrate, and a black matrix located on a side of the first flat layer away from the base substrate, where the black matrix has a plurality of opening regions, and color filters are arranged in corresponding opening regions; the color filters are configured to filter external incident light; and the first flat layer has a plurality of first concave faces arranged corresponding to the opening regions, the color filters fill the first concave faces, and the color filters further cover peripheral regions of the first concave faces.

Correspondingly, an embodiment of the present disclosure further provides a display device, including the above-mentioned display panel provided by an embodiment of the present disclosure.

DETAILED DESCRIPTION

Figure 1:
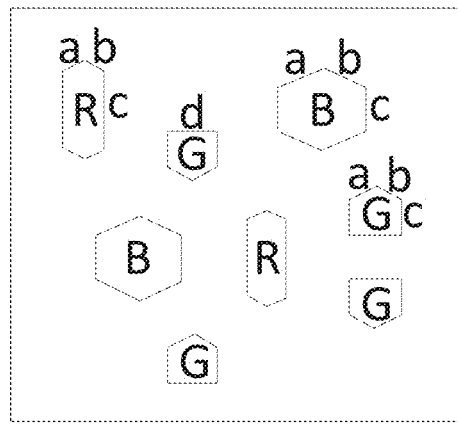
FIG. 1 is a schematic diagram of shapes and arrangement of sub-pixels provided in the related art.

In order to make the objectives, technical solutions, and advantages of embodiments of the present disclosure clearer, the technical solutions of embodiments of the present disclosure will be described clearly and completely in conjunction with the accompanying drawings of embodiments of the present disclosure. Obviously, the described embodiments are part of embodiments of the present disclosure, rather than all of embodiments. In the case of no conflict, embodiments in the present disclosure and features in embodiments can be combined with each other. Based on the described embodiments of the present disclosure, all other embodiments obtained by those of ordinary skill in the art without creative labor fall within the protection scope of the present disclosure.

Unless otherwise defined, technical terms or scientific terms used in the present disclosure shall have common meanings understood by those of common skills in the field to which the present disclosure belongs. The words "include" or "comprise" and other similar words used in the present disclosure mean that the component or item appearing before the word covers the component or item listed after the word and their equivalents, but does not exclude other components or items. Similar words such as "connected" or "linked" are not limited to physical or mechanical connections, but may include electrical connections, whether direct or indirect. "Inner", "outer", "upper", "lower", etc. are only used to indicate the relative position relationship. When the absolute position of the described object changes, the relative position relationship may also change accordingly.

It should be noted that the size and shape of each figure in the drawings do not reflect the true ratio, but are only to illustrate the present disclosure. The same or similar reference numerals indicate the same or similar components or components with the same or similar functions.

Figure 2:
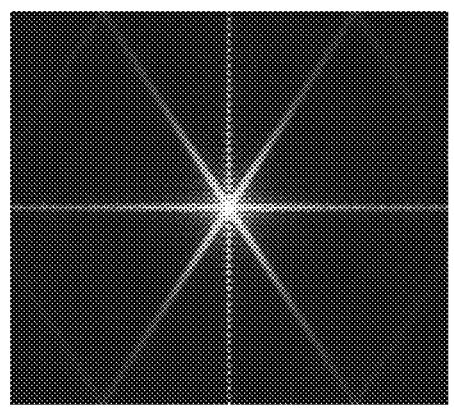
FIG. 2 is a schematic diagram of theoretical color separation of a display product in the related art.
Figure 3:
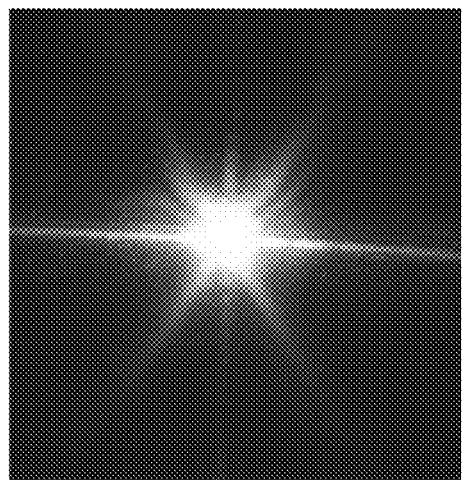
FIG. 3 is a schematic diagram of actual color separation of a display product in the related art.

Compared with OLED flexible products with pasted polarizers, the COE technology has the huge advantages of thin thickness and low power consumption. Especially for folding products, these advantages are more conducive to improving bending performance of the folding products. FIG. 1 is a schematic diagram of currently-adopted GGRB pixel distribution. R and B adopt a hexagonal design, G adopts a pentagonal design, and black matrixes (BMs) corresponding to openings adopt a corresponding hexagonal and pentagonal design. In a color film of GGRB pixels, a side a of R is parallel to a side a of G and a side a of B, which may be regarded as one direction; a side b of R is parallel to a side b of G and a side b of B, which may be regarded as one direction; a side c of R is parallel to a side c of G and a side c of B, which may be regarded as one direction; in addition, a side d of G may be regarded as one direction; and because diffraction effects in these four directions are obvious, the color film of GGRB and the BMs generate four directions of diffracted intensity, and diffracted light in these four directions is relatively strong, resulting in serious color separation. FIG. 2 is a theoretical diffraction result obtained through simulation by using Matlab software, and a diffraction intensity distribution is in an asterisk shape. FIG. 3 is a photographing result of color separation of an actual product, and its intensity distribution is also in an asterisk shape. It may be seen that the current COE technology has a disadvantage that an appearance of a screen inevitably produces color separation.

Figure 4:
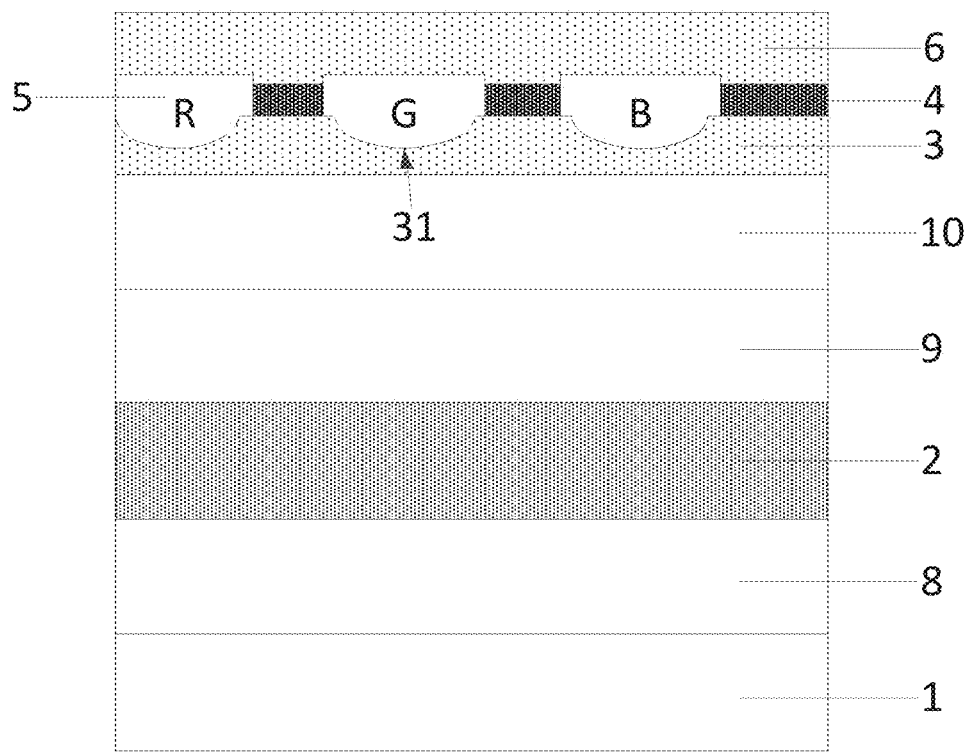
FIG. 4 is a schematic structural diagram of a display panel provided by an embodiment of the present disclosure.

A display panel provided by an embodiment of the present disclosure, as shown in FIG. 4, includes: a base substrate 1, a light-emitting device 2 located on the base substrate 1, a first flat layer 3 located on a side of the light-emitting device 2 away from the base substrate 1, and a black matrix 4 located on a side of the first flat layer 3 away from the base substrate 1, where the black matrix 4 has a plurality of opening regions, color filters 5 are arranged in corresponding opening regions, and the color filters 5 are configured to filter external incident light.

Figure 5:
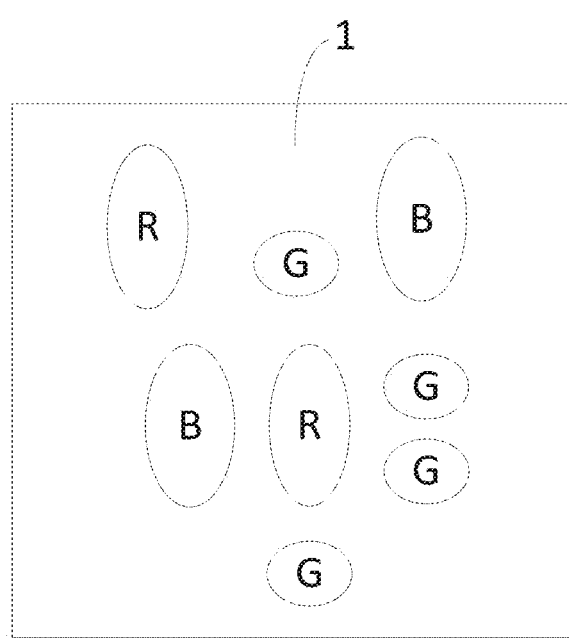
FIG. 5 is a schematic diagram of shapes and arrangement of sub-pixels provided by an embodiment of the present disclosure.

The first flat layer 3 has a plurality of first concave faces 31 arranged corresponding to the opening regions, the color filters 5 fill the first concave faces 31, and the color filters 5 further cover peripheral regions of the first concave faces 31. As shown in FIG. 5, FIG. 5 is a pattern of orthographic projections of surfaces of the color filters 5 making contact with the first concave faces 31 on the base substrate 1.

In an embodiment of the present disclosure, in an off-screen state, when external light is irradiated on the display panel, there is a diffraction effect when ambient light reflected by an internal structure of the display panel propagates to a light emitting side of the display panel. According to the diffraction theory, if the light is restricted in a certain direction, a diffraction pattern expands along the direction and diffracts, which makes the light emitted from that direction more concentrated. The more restricted the light is, the greater the diffraction effect is. The first flat layer in the display panel provided by the present disclosure has the plurality of first concave faces corresponding to the opening regions, the color filters fill the first concave faces, and the color filters also cover the peripheral regions of the first concave faces, namely the color filters are subjected to patterned design so that the light propagating to an edge of each opening region, that is, the light emitted from the opening region, diffuses and propagates in all directions, which weakens the diffraction effect and reduces a degree of color separation. In addition, embodiments of the present disclosure may improve a color separation phenomenon of the display panel without adding an additional structure.

The first flat layer in the display panel provided by the present disclosure has the plurality of first concave faces corresponding to the opening regions, the color filters fill the first concave faces, and the color filters also cover the peripheral regions of the first concave faces. That is, the present disclosure reduces a sudden change in closing sizes at sharp corners of the color filters by designing the arc-shaped color filters, and improves the color separation phenomenon of large-area color light distribution caused by directionality, so that when the display panel is in the dark state, the diffraction distribution of the light emitted from each opening region may be weakened, the light emitted from the opening regions is uniformly distributed, the degree of color separation can be reduced, and the reliability of the display panel can be improved.

A principle that the display panel shown in FIG. 4 can reduce the degree of color separation will be described in detail below.

Figure 6:
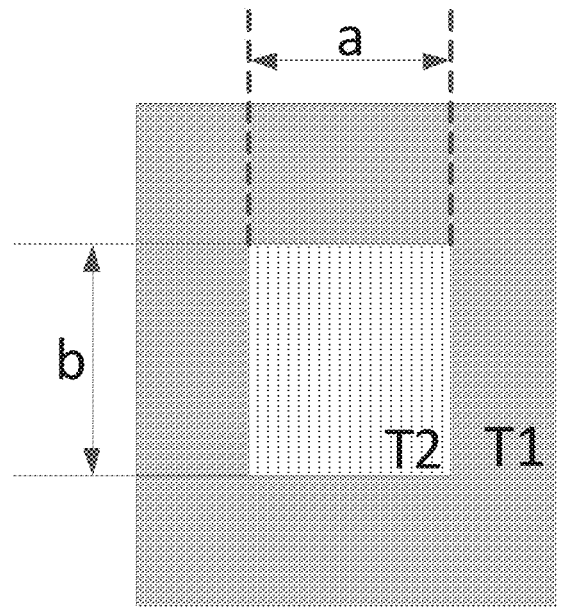
FIG. 6 is a top view schematic diagram of two kinds of film layers of different transmittances.

FIG. 6 is a top view of film layers of a medium 1 and a medium 2 with different transmittances. T1 and T2 represent the two media with different transmittances. A diffracted light intensity $I_d$ after the light passes through the medium 1 and the medium 2 may be calculated by the following formula:

$$I_d = \left(\frac{\sin u}{u}\right)^2 \left(\frac{\sin v}{v}\right)^2 (T_2 - T_1)I_0,$$

$$u = \frac{2\pi a \sin\theta}{\lambda}, v = 2\pi b \sin\theta'/\lambda$$

Here, θ represents an angle deviated from incident light in a dimension direction a, θ' represents an angle deviated from the incident light in a dimension direction b, and $I_0$ represents an intensity of the incident light.

Figure 7:
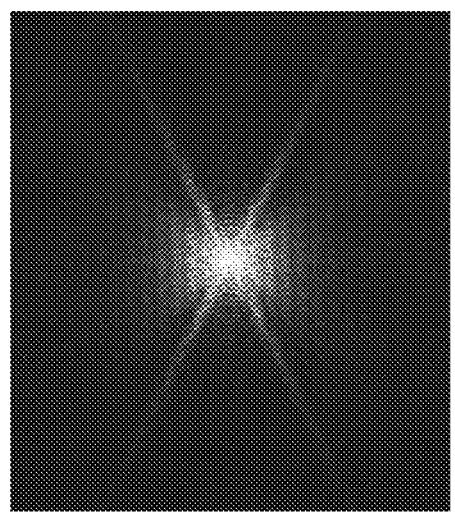
FIG. 7 is a schematic diagram of actual color separation of a display product corresponding to FIG. 4.

In related designs, a surface of the first flat layer in contact with the color filters is flat. When the external ambient light enters the display panel and is reflected by the internal structure of the display panel, a diffraction position is an interface between the first flat layer and the black matrix. T2 in FIG. 6 corresponds to a transmittance of the first flat layer, and T1 corresponds to a transmittance of the black matrix. An embodiment of the present disclosure changes a shape of each color filter by changing a shape of the first flat layer, so that the diffraction position becomes an interface between the first flat layer and the color filter. T2 in FIG. 6 corresponds to the transmittance of the first flat layer, and T1 corresponds to a transmittance of the color filter. At present, the transmittance of the flat layer is ≥95%, the transmittance of the black matrix is ≤1%, and the transmittance of the color filters is ≥70%. Therefore, the diffracted light intensity $I_d$ of the structure of the display panel provided by an embodiment of the present disclosure is less than a diffracted light intensity in the related art, and the diffracted light intensity of the structure of the present disclosure will be reduced by about 25%. In the related art, the diffracted light is mainly distributed in the four directions in FIG. 2, and the diffracted light in these four directions is relatively strong, resulting in serious color separation. In an embodiment of the present disclosure, the arc-shaped color filter is designed to make the diffracted light uniformly distributed in all directions. FIG. 7 is a diffraction result test chart corresponding to FIG. 4 of an embodiment of the present disclosure. As shown in FIG. 7, the diffraction directions and diffraction intensity are significantly improved. Therefore, the structure of the present disclosure may reduce the diffracted light intensity and balance the directions of the diffracted light, thereby improving the color separation phenomenon.

In some embodiments, the base substrate may be a rigid substrate or a flexible substrate, where the rigid substrate may be but not limited to glass or the like; and the flexible substrate may be but not limited to polyethylene terephthalate, ethylene terephthalate, polyimide or the like.

Figure 8:
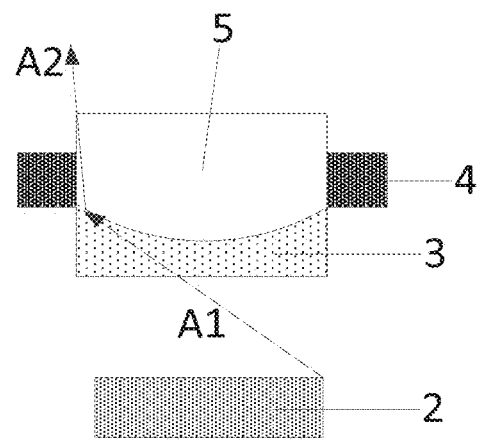
FIG. 8 is a schematic diagram of a convergence principle of a convex lens corresponding to FIG. 4.

In some embodiments, in the abovementioned display panel provided by an embodiment of the present disclosure, as shown in FIG. 4, a refractive index of each of the color filters 5 is greater than a refractive index of the first flat layer 3. In this way, each of the color filters 5 and the first flat layer 3 form a convex lens. The structure may partially converge the light emitted by the light-emitting device 2, thereby increasing a light emitting efficiency of the light-emitting device 2. In some embodiments, as shown in FIG. 8, FIG. 8 is a schematic diagram of a convergence effect (an arrow A2) of the light (an arrow A1) emitted by the light-emitting device 2 to the convex lens structure.

Figure 9:
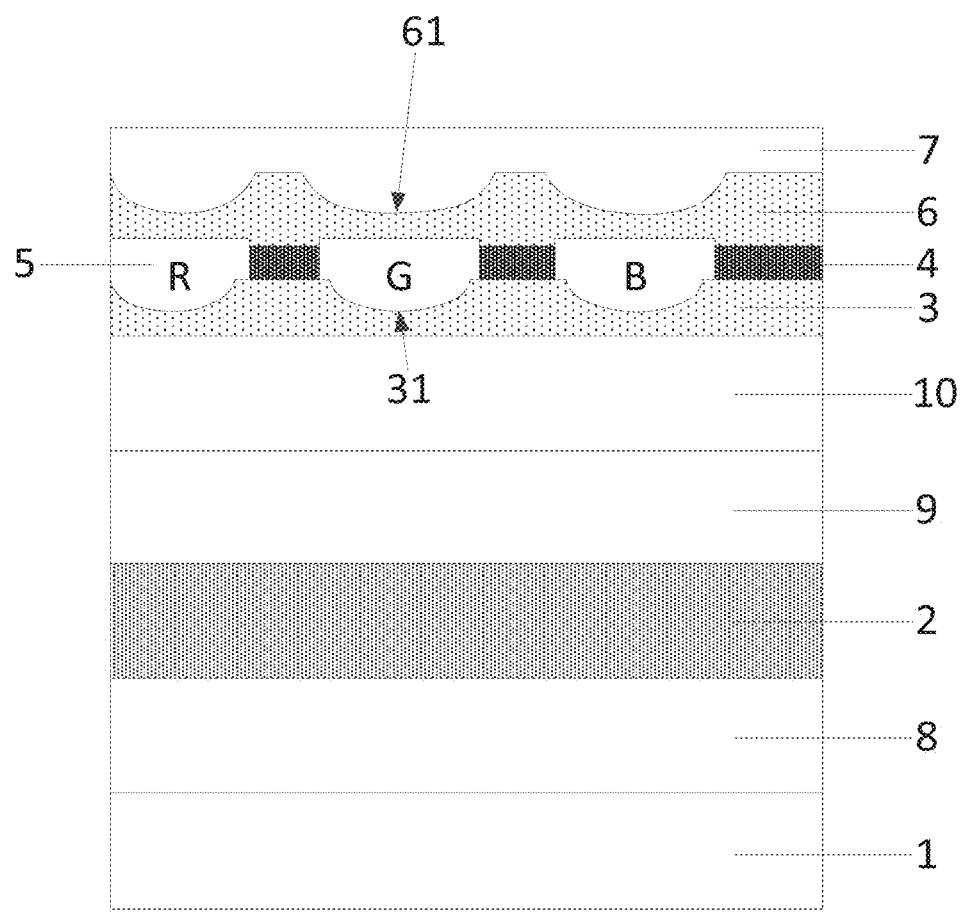
FIG. 9 is a schematic structural diagram of another display panel provided by an embodiment of the present disclosure.

In some embodiments, in the abovementioned display panel provided by an embodiment of the present disclosure, as shown in FIG. 9, the display panel further includes: a second flat layer 6 located on a side of each of the color filters 5 away from the base substrate 1, and an optical adhesive layer 7 located on a side of the second flat layer 6 away from the base substrate 1. The second flat layer 6 has a plurality of second concave faces 61 arranged corresponding to the opening regions, and the optical adhesive layer 7 fills the second concave faces 61. The second flat layer 6 is configured to protect the black matrix and the color filters, and can protect a display effect of the display panel and improve the reliability of the display panel. A material of the second flat layer 6 may be, but not limited to materials with fluidity such as resin.

Figure 10:
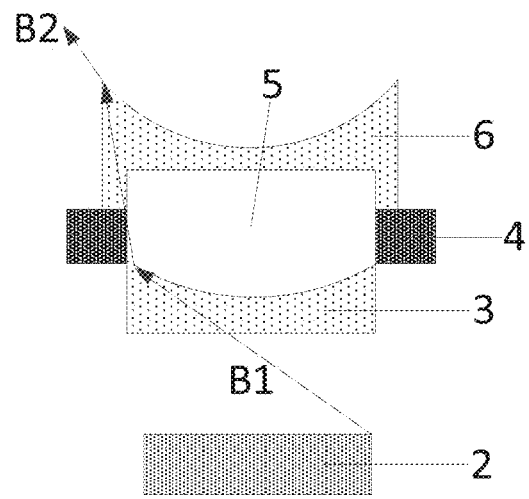
FIG. 10 is a schematic diagram of a divergence principle of a concave lens corresponding to FIG. 9.

A refractive index of the second flat layer 6 is larger than a refractive index of the optical adhesive layer 7. In this way, the second flat layer 6 and the optical adhesive layer 7 form a concave lens. The structure may increase light emitting angles of the light emitted from the light-emitting device 2, thereby increasing a viewing angle and making a certain improvement to weaker brightness of a large viewing angle. In some embodiments, as shown in FIG. 10, FIG. 10 is a schematic diagram of a divergence effect (an arrow B2) of the light emitted by the light-emitting device 2 (an arrow B1) to the concave lens structure.

In some embodiments, in the abovementioned display panel provided by an embodiment of the present disclosure, as shown in FIG. 9, an area of an orthographic projection of each of the second concave faces 61 on the base substrate 1 is larger than an area of an orthographic projection of each of the first concave faces 31 on the base substrate 1. In this way, more light may be refracted to a large angle, the brightness of the large viewing angle is further increased, and the display effect is improved.

In some embodiments, in the abovementioned display panel provided by an embodiment of the present disclosure, a refractive index of the first flat layer and the refractive index of the second flat layer are in a range of 1.50 to 1.64, a refractive index of each of the color filters is in a range of 1.60 to 1.70, and the refractive index of the optical adhesive layer is in a range of 1.40 to 1.50.

Figure 11:
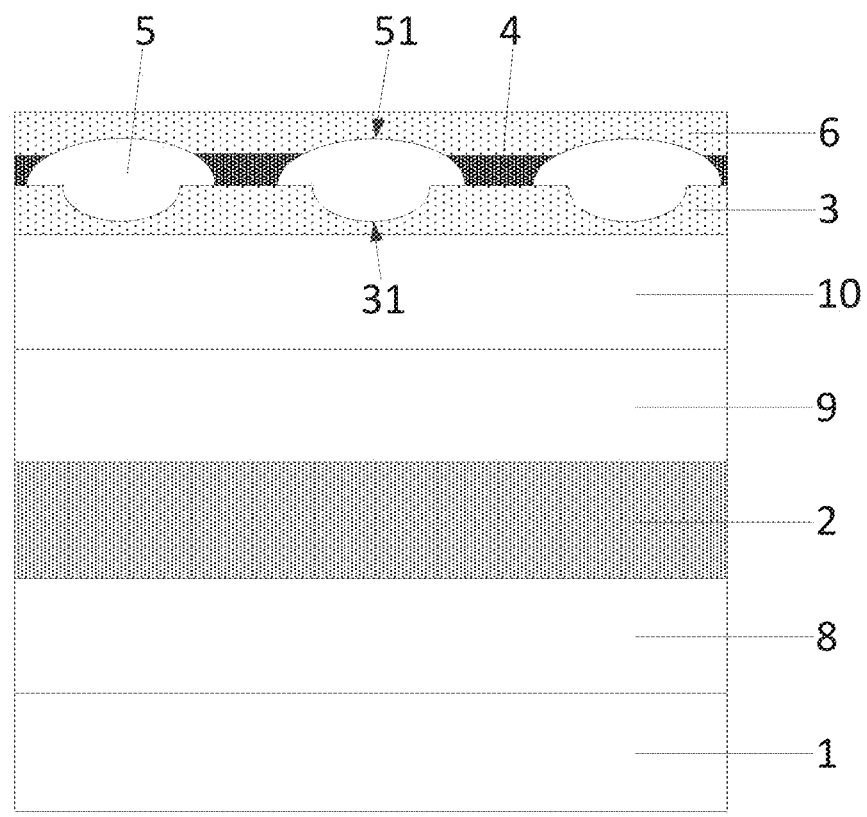
FIG. 11 is a schematic structural diagram of yet another display panel provided by an embodiment of the present disclosure.

In some embodiments, in the abovementioned display panel provided by an embodiment of the present disclosure, as shown in FIG. 11, the display panel further includes a second flat layer 6 located on a side of each of the color filters 5 away from the base substrate 1; and surfaces of the color filters 5 making contact with the black matrix 4 and the second flat layer 6 are convex faces. That is, surfaces of the color filters 5 away from the base substrate 1 are arc-shaped, so that emitting angles of the light may be increased and the large viewing angle is realized.

In some embodiments, in the abovementioned display panel provided by an embodiment of the present disclosure, as shown in FIG. 11, a ratio of an aperture of each of the convex faces 51 to an aperture of each of the first concave faces 31 is in a range of 6/5 to 4/3, which is conducive to realization of the large viewing angle.

In some embodiments, in the abovementioned display panel provided by an embodiment of the present disclosure, as shown FIG. 11, a shape of an orthographic projection of each of the convex faces on the base substrate 1 includes a circular shape or an oval shape. In some embodiments, as shown in FIG. 5, FIG. 5 is an orthographic projection pattern of the surfaces of the color filters 5 making contact with the first concave faces 31 on the base substrate 1, and FIG. 5 may also be represented as an orthographic projection pattern of the convex faces 51 on the substrate 1.

In some embodiments, in the abovementioned display panel provided by an embodiment of the present disclosure, a display region of the display panel has a plurality of pixels, such as red sub-pixels, green sub-pixels, and blue sub-pixels. The color filters in FIG. 4, FIG. 9 and FIG. 11 correspondingly include red filters R, green filters G and blue filters B. On the one hand, the color filters can filter the emitted light and improve color purity of the emitted light; and on the other hand, the color filters can filter the external light, and may reduce the ambient light entering the display panel, thereby reducing reflection of the ambient light by the display panel and improving user experience. In order to solve the problem of life of the sub-pixels, a manner of Pentile sub-pixel arrangement is adopted. The quantity of red and blue sub-pixels is cut in half in the Pentile arrangement. At the same time, in order to maintain color accuracy when the three primary colors are mixed, areas of the red and blue sub-pixels must be increased, and brightness of the red and blue sub-pixels is appropriately reduced. As shown in FIG. 5, the quantity of the red filters R and the blue filters B are both ½ of the quantity of the green filters G, and sizes of the red filters R and sizes of the blue filters B are larger than sizes of the green filters G.

In some embodiments, in the abovementioned display panel provided by an embodiment of the present disclosure, as shown in FIG. 4, FIG. 9 and FIG. 11, the display panel further includes: a thin film transistor array layer 8 located between the base substrate 1 and the light-emitting device 2, and an encapsulation layer 9 located between the light-emitting device 2 and the first flat layer 3. The thin film transistor array layer 8 in an embodiment of the present disclosure is configured to drive the light-emitting device 2 to emit light, and the thin film transistor array layer 8 may include an active layer, a gate insulating layer, a gate layer, a source and drain conductive layer and a planarization layer. The encapsulation layer 9 in an embodiment of the present disclosure can isolate the light-emitting device 2 from the external, water and oxygen are prevented from invading an organic light-emitting layer in the light-emitting device 2 of the display panel to affect the service life of the display panel. At the same time, an outer surface of the encapsulation layer 9 is flat, so that a subsequently-manufactured film layer (for example, a touch control layer) can be manufactured on the flat surface, which is more beneficial to the display effect of the display panel.

Optionally, the encapsulation layer 9 may use a thin film encapsulation (TFE) layer.

In some embodiments, in the abovementioned display panel provided by an embodiment of the present disclosure, as shown in FIG. 4, FIG. 9 and FIG. 11, the display panel further includes a touch control layer 10 located between the encapsulation layer 9 and the first flat layer 3. The display panel provided by an embodiment of the present disclosure includes the touch control layer 10 which can realize touch control, so that functions of the display panel become more diversified, and the application range becomes wider.

Figure 12:
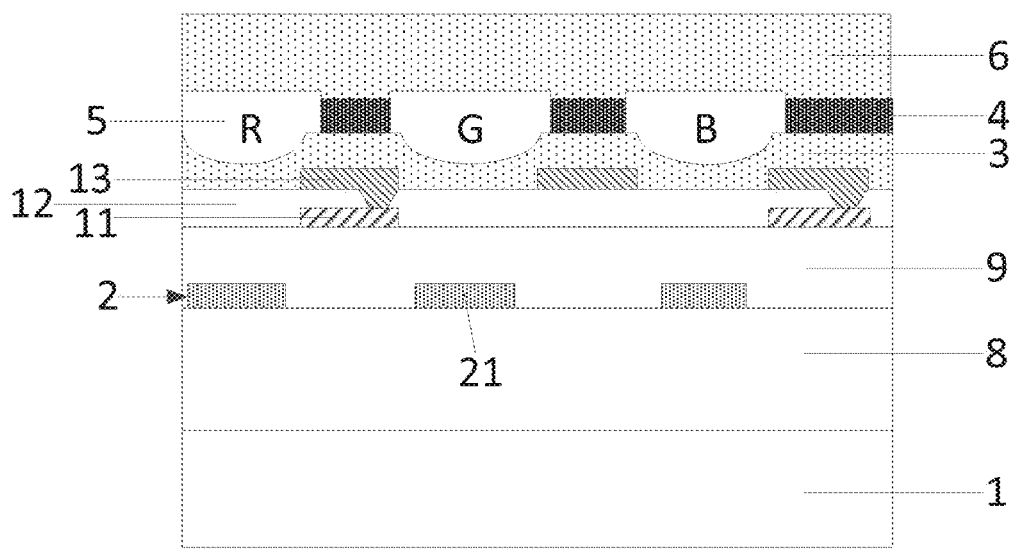
FIG. 12 is a schematic structural diagram of further display panel provided by an embodiment of the present disclosure.
Figure 13:
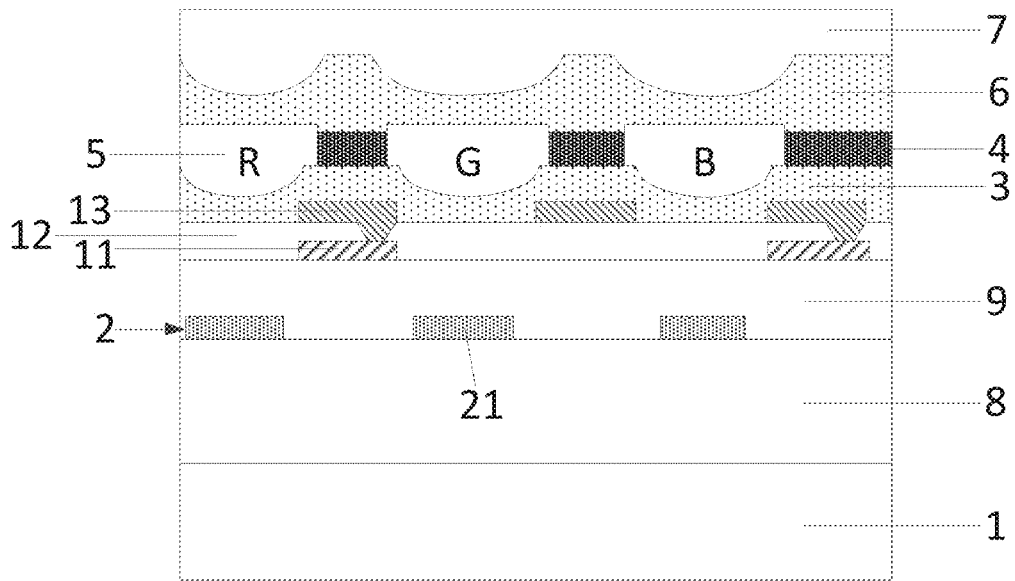
FIG. 13 is a schematic structural diagram of yet further display panel provided by an embodiment of the present disclosure.
Figure 14:
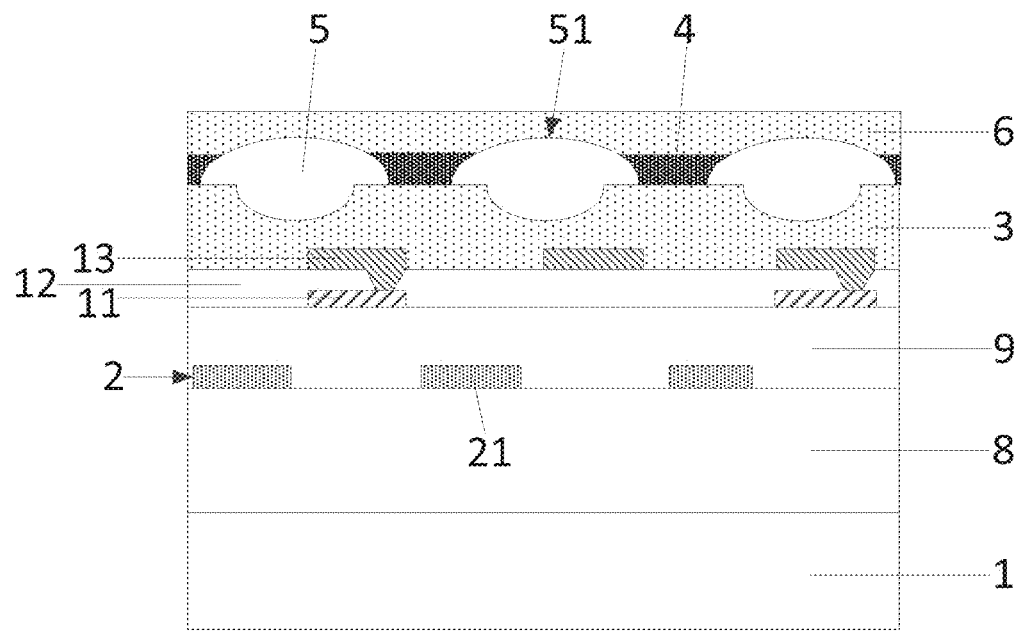
FIG. 14 is a schematic structural diagram of further another display panel provided by an embodiment of the present disclosure.

In some embodiments, in the abovementioned display panel provided by an embodiment of the present disclosure, as shown in FIGS. 12-14, the light-emitting device 2 includes a plurality of light-emitting units 21. The plurality of light-emitting units 21 are arranged in one-to-one correspondence with the opening regions (the color filters 5). Each of the light-emitting units 21 includes a first electrode, a second electrode and an organic light-emitting layer located between the first electrode and the second electrode. In some embodiments, the first electrode is close to the base substrate 1, the first electrode is a reflecting electrode, and the first electrode is configured to reflect the ambient light emitted into the display panel out when the display panel is in an off-screen state.

It should be noted that the light-emitting device in an embodiment of the present disclosure may include: an OLED device or a quantum dot light emitting diode (QLED) device, which is not specifically limited here.

In some embodiments, in the abovementioned display panel provided by an embodiment of the present disclosure, as shown in FIGS. 12-14, the touch control layer 10 includes a first touch control electrode 11, an insulating layer 12, and a second touch control electrode 13 which are arranged in a stacked mode. The first touch control electrode 11 and the second touch control electrode 13 are connected by a via hole penetrating through the insulating layer 12. One of the first touch control electrode 11 and the second touch control electrode 13 is a driving electrode, and the other is a sensing electrode.

Based on the same inventive concept, an embodiment of the present disclosure further provides a display device, including any of the abovementioned display panels provided by embodiments of the present disclosure.

Figure 15:
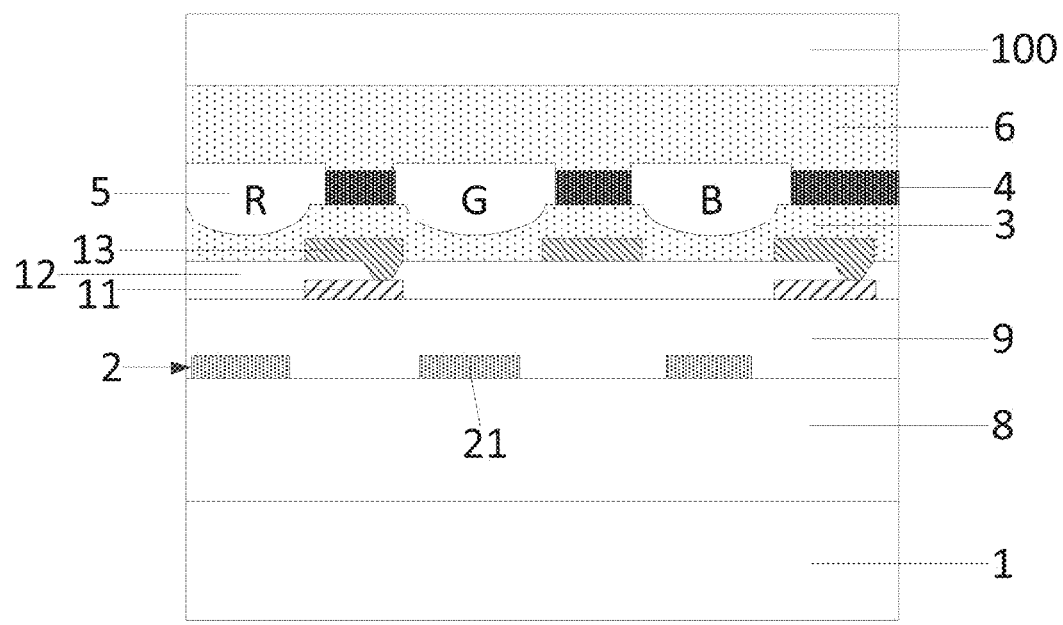
FIG. 15 is a schematic structural diagram of a display device provided by an embodiment of the present disclosure.
Figure 16:
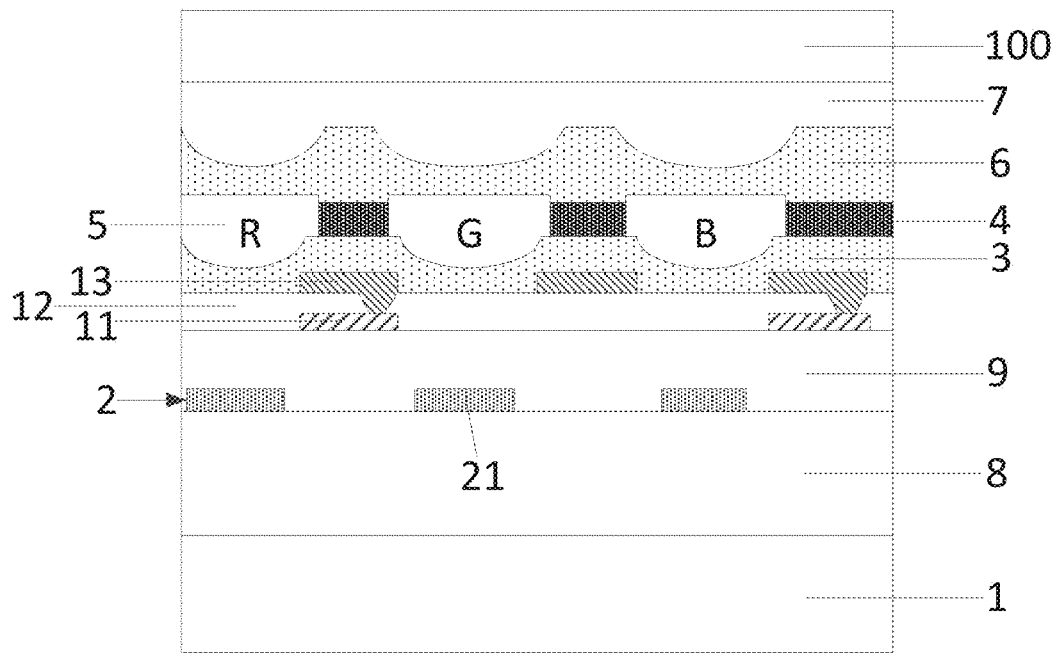
FIG. 16 is a schematic structural diagram of another display device provided by an embodiment of the present disclosure.
Figure 17:
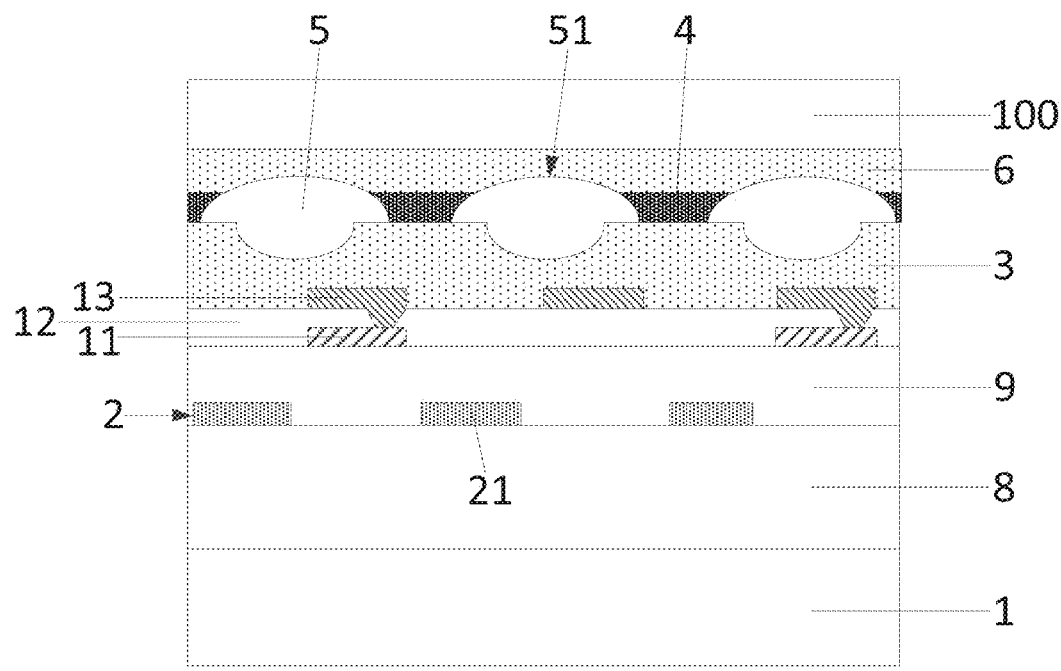
FIG. 17 is a schematic structural diagram of yet another display device provided by an embodiment of the present disclosure.

In some embodiments, in the abovementioned display panel provided by an embodiment of the present disclosure, as shown in FIGS. 15-17, the display panel may further include a cover plate 100 covering the display panel. In some embodiments, the cover plate 100 may be a rigid cover plate or a flexible cover plate.

The display device may be any product or component with a display function, such as a mobile phone, a tablet computer, a television, a displayer, a notebook computer, a digital photo frame, a navigator, and the like. Other indispensable components of the display device are understood by those of ordinary skilled in the art, and will not be repeated here, nor should they be used as a limitation to the present disclosure. A principle of problem solving of the display device is similar to that of the aforementioned quantum dot light-emitting device. Therefore, for implementation of the display device, reference may be made to implementation of the aforementioned display panel, and repetition will not be made here.

According to the display panel and the display device provided by embodiments of the present disclosure, the display panel includes: the base substrate, the light-emitting device located on the base substrate, the first flat layer located on a side of the light-emitting device away from the base substrate, and the black matrix located on a side of the first flat layer away from the base substrate, where the black matrix has the plurality of opening regions, and the color filters are arranged in the opening regions; the color filters are configured to filter the external incident light; and the first flat layer has the plurality of first concave faces arranged corresponding to the opening regions, the color filters fill the first concave faces, and the color filters further cover the peripheral regions of the first concave faces. The first flat layer in the display panel provided by the present disclosure has the plurality of first concave faces arranged corresponding to the opening regions, the color filters fill the first concave faces, and the color filters further cover the peripheral regions of the first concave faces, so that when the display panel is in the dark state, the light emitted from the opening regions is uniformly distributed, the degree of color separation can be lowered and the reliability of the display panel is improved.

Although embodiments of the present disclosure have been described, those of skilled in the art can make additional variations and modifications to these embodiments once they learn the basic inventive concept. Therefore, the appended claims are intended to be interpreted as including embodiments and all variations and modifications falling within the scope of the present disclosure.

Apparently, those of skill in the art can make various variations and modifications to embodiments of the present disclosure without departing from the spirit and scope of embodiments of the present disclosure. In this way, if these modifications and variations of embodiments of the present disclosure fall within the scope of the claims of the present disclosure and their equivalent technologies, the present disclosure is also intended to include these modifications and variations.

What is claimed is:

1. A display panel, comprising: a base substrate, a light-emitting device located on the base substrate, a first flat layer located on a side of the light-emitting device away from the base substrate, and a black matrix located on a side of the first flat layer away from the base substrate, wherein the black matrix has a plurality of opening regions, color filters are arranged in corresponding opening regions, and the color filters are configured to filter external incident light; and the first flat layer has a plurality of first concave faces arranged corresponding to the opening regions, the color filters fill the first concave faces, and the color filters further cover peripheral regions of the first concave faces;

wherein the display panel further comprises:
a second flat layer located on a side of each of the color filters away from the base substrate, and an optical adhesive layer located on a side of the second flat layer away from the base substrate;
wherein the second flat layer has a plurality of second concave faces arranged corresponding to the opening regions, and the optical adhesive layer fills the second concave faces; and a refractive index of the second flat layer is larger than a refractive index of the optical adhesive layer.

2. The display panel according to claim 1, wherein a refractive index of each of the color filters is larger than a refractive index of the first flat layer.

3. The display panel according to claim 1, wherein an area of an orthographic projection of each of the second concave faces on the base substrate is larger than an area of an orthographic projection of each of the first concave faces on the base substrate.

4. The display panel according to claim 1, wherein a refractive index of the first flat layer and the refractive index of the second flat layer are in a range of 1.50 to 1.64, a refractive index of each of the color filters is in a range of 1.60 to 1.70, and the refractive index of the optical adhesive layer is in a range of 1.40 to 1.50.

5. The display panel according to claim 1, further comprising a second flat layer located on a side of each of the color filters away from the base substrate; and surfaces of the color filters making contact with the black matrix and the second flat layer are convex faces.

6. The display panel according to claim 5, wherein a ratio of an aperture of each of the convex faces to an aperture of each of the first concave faces is in a range of 6/5 to 4/3.

7. The display panel according to claim 5, wherein a shape of an orthographic projection of each of the convex faces on the base substrate comprises a circular shape or an oval shape.

8. The display panel according to claim 5, wherein the color filters comprise red filters, green filters and blue filters, a quantity of the red filters and a quantity of the blue filters are both ½ of a quantity of the green filters, and sizes of the red filters and sizes of the blue filters are larger than sizes of the green filters.

9. The display panel according to claim 1, further comprising: a thin film transistor array layer located between the base substrate and the light-emitting device, and an encapsulation layer located between the light-emitting device and the first flat layer.

10. The display panel according to claim 9, further comprising a touch control layer located between the encapsulation layer and the first flat layer.

11. A display device, comprising a display panel, wherein the display panel comprises: a base substrate, a light-emitting device located on the base substrate, a first flat layer located on a side of the light-emitting device away from the base substrate, and a black matrix located on a side of the first flat layer away from the base substrate, wherein the black matrix has a plurality of opening regions, color filters are arranged in corresponding opening regions, and the color filters are configured to filter external incident light; and the first flat layer has a plurality of first concave faces arranged corresponding to the opening regions, the color filters fill the first concave faces, and the color filters further cover peripheral regions of the first concave faces;

wherein the display panel further comprises:
a second flat layer located on a side of each of the color filters away from the base substrate, and an optical adhesive layer located on a side of the second flat layer away from the base substrate;
wherein the second flat layer has a plurality of second concave faces arranged corresponding to the opening regions, and the optical adhesive layer fills the second concave faces; and a refractive index of the second flat layer is larger than a refractive index of the optical adhesive layer.

12. The display device according to claim 11, wherein a refractive index of each of the color filters is larger than a refractive index of the first flat layer.

13. The display device according to claim 11, wherein an area of an orthographic projection of each of the second concave faces on the base substrate is larger than an area of an orthographic projection of each of the first concave faces on the base substrate.

14. The display device according to claim 11, wherein a refractive index of the first flat layer and the refractive index of the second flat layer are in a range of 1.50 to 1.64, a refractive index of each of the color filters is in a range of 1.60 to 1.70, and the refractive index of the optical adhesive layer is in a range of 1.40 to 1.50.

15. The display device according to claim 11, further comprising a second flat layer located on a side of each of the color filters away from the base substrate; and surfaces of the color filters making contact with the black matrix and the second flat layer are convex faces.

16. The display device according to claim 15, wherein a ratio of an aperture of each of the convex faces to an aperture of each of the first concave faces is in a range of 6/5 to 4/3.

17. The display device according to claim 15, wherein a shape of an orthographic projection of each of the convex faces on the base substrate comprises a circular shape or an oval shape.

18. The display device according to claim 15, wherein the color filters comprise red filters, green filters and blue filters, a quantity of the red filters and a quantity of the blue filters are both ½ of a quantity of the green filters, and sizes of the red filters and sizes of the blue filters are larger than sizes of the green filters.

* * * * *